United States Patent [19]

Bertellotti et al.

[11] 4,377,906

[45] Mar. 29, 1983

[54] TOOL FOR INSERTING AND EXTRACTING PRINTED CIRCUIT CARDS

[75] Inventors: Ansano Bertellotti, Addison; Arvo Taliste, Downers Grove, both of Ill.

[73] Assignee: GTE Automatic Electric Labs Inc., Northlake, Ill.

[21] Appl. No.: 274,900

[22] Filed: Jun. 18, 1981

[51] Int. Cl.³ .................................. H05K 3/36
[52] U.S. Cl. ................................. 29/747; 29/267; 29/758; 29/764; 294/15
[58] Field of Search ............... 29/764, 762, 747, 758, 29/267, 268, 278; 294/15

[56] References Cited

U.S. PATENT DOCUMENTS

| | | | |
|---|---|---|---|
| 2,691,506 | 10/1954 | Wilson | 29/267 X |
| 3,617,083 | 11/1971 | Koppensteiner et al. | 294/15 |
| 3,903,576 | 10/1974 | Stein | 29/764 |
| 4,109,379 | 8/1978 | Ratti et al. | 29/747 |

*Primary Examiner*—Carl E. Hall

*Attorney, Agent, or Firm*—Robert J. Black; Anthony Miologos

[57] ABSTRACT

A tool for inserting a printed circuit card into a holder the latter having top and bottom guide tracks and a rear wall having contacts engageable by terminal tabs on the card, as well as the extraction of such cards frm the holder, comprising a pistol grip type handle and a shaft extending perpendicularly outward from the handle. The shaft includes a hook on one end and is rotatably mounted to the handle on an opposite end. A plunger including a retractable stop bracket is slideably mounted on the shaft and is propelled forward via a spring loaded trigger bracket. By rotating the shaft and retracting the stop bracket the hook is engaged to the bottom guide track allowing the plunger to insert the circuit card into the holder and its associated contacts, when the trigger is squeezed. To extract the card the shaft is rotated to engage the rear of the circuit card handle and the stop bracket rested on the bottom guide track. The hook pulls and extracts the circuit card from the holder when the trigger bracket is squeezed.

7 Claims, 5 Drawing Figures

TOOL FOR INSERTING AND EXTRACTING PRINTED CIRCUIT CARDS

BACKGROUND OF THE INVENTION (1) Field of the Invention

The present invention relates to a tool designed to facilitate the insertion of a printed circuit card into a holder therefore as well as the subsequent extraction from the holder.

(2) Description of the Prior Art

Today, printed circuit cards are frequently assembled in a holder rack having the shape of an open topped box whose side walls form tracks for the guidance of cards sent to and out of their assembled position. Terminal tabs on a base strip or block of each board fit into a socket having co-acting contacts to complete a connection to an external circuit. In practice, the track forming side walls may be horizontally disposed, with the contact bearing sockets arranged on the upright rear wall.

The placement of such printed circuit cards and their holder is a somewhat delicate operation since in the last phase an additional thrust must be exerted in order to interfit the co-acting connector pairs. In view of the great frictional resistance, attempts to insert a card with bare hands may cause injury to the operator whose fingers could be cut by the exposed front edges of the board when applying pressure thereto. It is also important to hold the card properly aligned with its guide channels in order to avoid bending stresses which could damage the printed circuits. Extracting the inserted card again poses problems since the abrupt reduction of frictional resistance upon disengagement of the connectors may lead to an accelerated withdrawal motion deviating from the straight linearity. These basic problems are perceptively increased as the printed circuit cards become larger which substantially increase the insertion and extraction force required to properly seat the cards.

Accordingly, a tool is usually required to properly seat these cards. The tool must be compact, simple to operate as well as human engineered to be comfortably operated by either hand. Many cards presently on the market have extraction and insertion mechanisms built on the printed circuit cards. This approach increases the individual card cost and therefore a separate tool is a more economical approach to the card insertion and removal requirement.

It therefore becomes an object of the present invention to provide an improved tool of the character described which facilitates both the insertion and extraction of such printed circuit cards.

SUMMARY OF THE INVENTION

The tool according to our invention comprises a pistol grip type handle including a shaft extending perpendicularly outward from the handle. The shaft terminates in a hooked or curved paw. The shaft is rotatably mounted to the pistol grip via a tab which may be manipulated to rotate the shaft and subsequently the hook. The plunger is slideably mounted via a central bore about the shaft and arranged to slide along the shaft. A front face of the plunger includes a groove disposed to rest against the circuit card edge. A deviation and stop bracket is also included which is used during the extracting of the circuit card and is moveable out of the way into a stored position when the tool is used to insert circuit cards. The assembly is completed by a spring loaded trigger bracket which when compressed by hand transfers the manual force to the plunger pushing the plunger forward.

The tool has been designed to work with holders of the type having an open card cage construction. The holders should have at least top and bottom front card guides oriented in an horizontal direction. The card guides also include transverse slots which accept lateral edges of the printed circuit card which hold and guide the card to the connector found in the rear of the holder. With this in mind, the operation of the tool will be explained.

To use the tool to insert a circuit card a card which includes a handle on a front edge is first inserted by hand into the holder until it reaches the connector entrance. At this point the tool is applied by first rotating the tab, moving the hook into a downwardly position. The hook is then inserted into the card holder area between the bottom of the card handle and the card guide. The hook is then engaged behind the front card guide and the plunger is nested on the printed circuit card edge below the card handle. A free hand is then placed on top of the card handle and the trigger squeezed which moves the plunger forward inserting the card into the connector.

To withdraw the printed circuit board the hook is turned upward by rotating the tab. The deviation and stop bracket is extracted from the plunger and is turned toward the front parallel with the plunger. The curved paw is then hooked behind the circuit card handle and at the same time a front lip of the deviation stop bracket is rested against a front edge of the bottom card guide. A free hand again is placed on the top of the circuit card and the trigger is actuated allowing the hook to pull the circuit card from the connector.

DESCRIPTION OF THE DRAWINGS

The above and other features of our invention will now be described in detail with reference to the accompanying drawings in which:

FIG. 1A is a front elevational view of the tool plunger;

FIG. 1B is a side elevational view showing the deviation and stop bracket retracted;

DESCRIPTION OF THE PREFERRED EMBODIMENT

Figure 1:
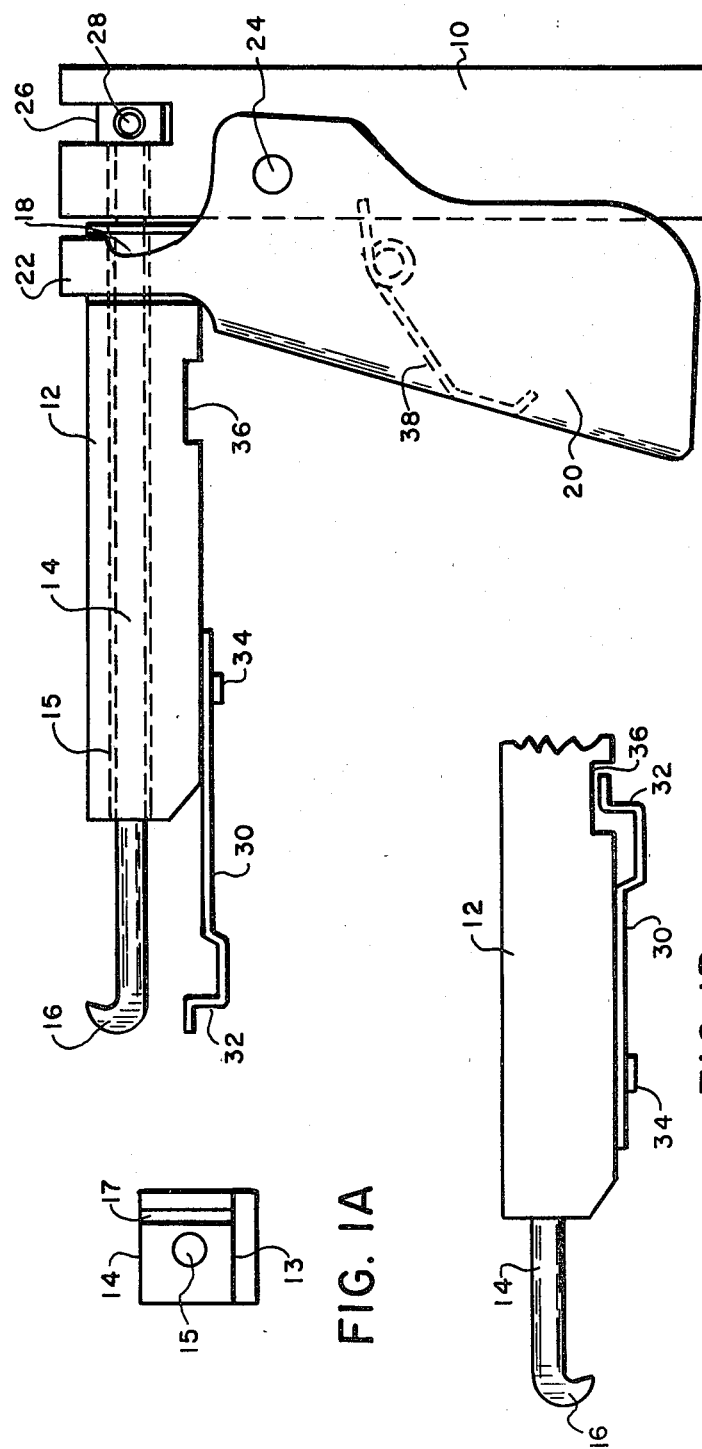
FIG. 1 is a side elevational view of the tool of the present invention.

Turning now to the included drawings FIG. 1 illustrates the tool of the present invention. The tool includes a rectangular handle 10 having a shaft 14 extending outward perpendicular to the handle from a top portion thereof. Shaft 14 terminates at a tab 26 on a rear end and at a hook or paw 16 on an opposite end. Tab 26 is arranged to be rotated via handle 28 to allow hook 16 to be oriented in either an upward or a downward position. As can be seen in FIG. 1 with the handle oriented toward the left hook 16 is pointed upward. Accordingly if handle 28 is moved toward the right hook 16 would be pointing downward. A plunger 12 is slideably mounted over shaft 14 via a central bore 15. Plunger 12 further includes a notched recess 18 on a left side thereof and a notched recess 36 on a bottom side. A deviation and stop bracket 30 which also includes a shoulder portion 32 is mounted to the bottom side of plunger 12 via pin 34. The deviation and stop bracket is used only when extracting circuit cards and when not used the shoulder portion 32 is housed within recess 36 as shown in FIG. 1B. As can be seen on FIG. 1A the plunger 12 further includes a circuit card nesting notch 17 on a front face of plunger 12. Notch 17 nests the front edge of a circuit card when the tool is used to insert a circuit card into the holder. The assembly is completed by a trigger bracket 20 which is pivotally mounted to the handle 10 via a pin 24. Trigger bracket 20 also includes an upper lever 22. Lever 22 is housed within notch 18. A spring 38 biases the trigger bracket 20 outward.

The tool is intended to be used in circuit card housings of the type which have at least top and bottom horizontal card guides found on the front of the housing. These card guides also include transverse slots which are arranged to receive opposite edges of the circuit card. The slots hold and guide the card to associated connectors which are vertically oriented at the back of the holder. Further, the cards may also include a handle on a front edge in order to be easier to grasp when extracting the circuit card from the holder.

With this in mind an explanation of the insertion and consequently extraction of a circuit card employing the tool of the present invention will now be described in detail.

Figure 2:
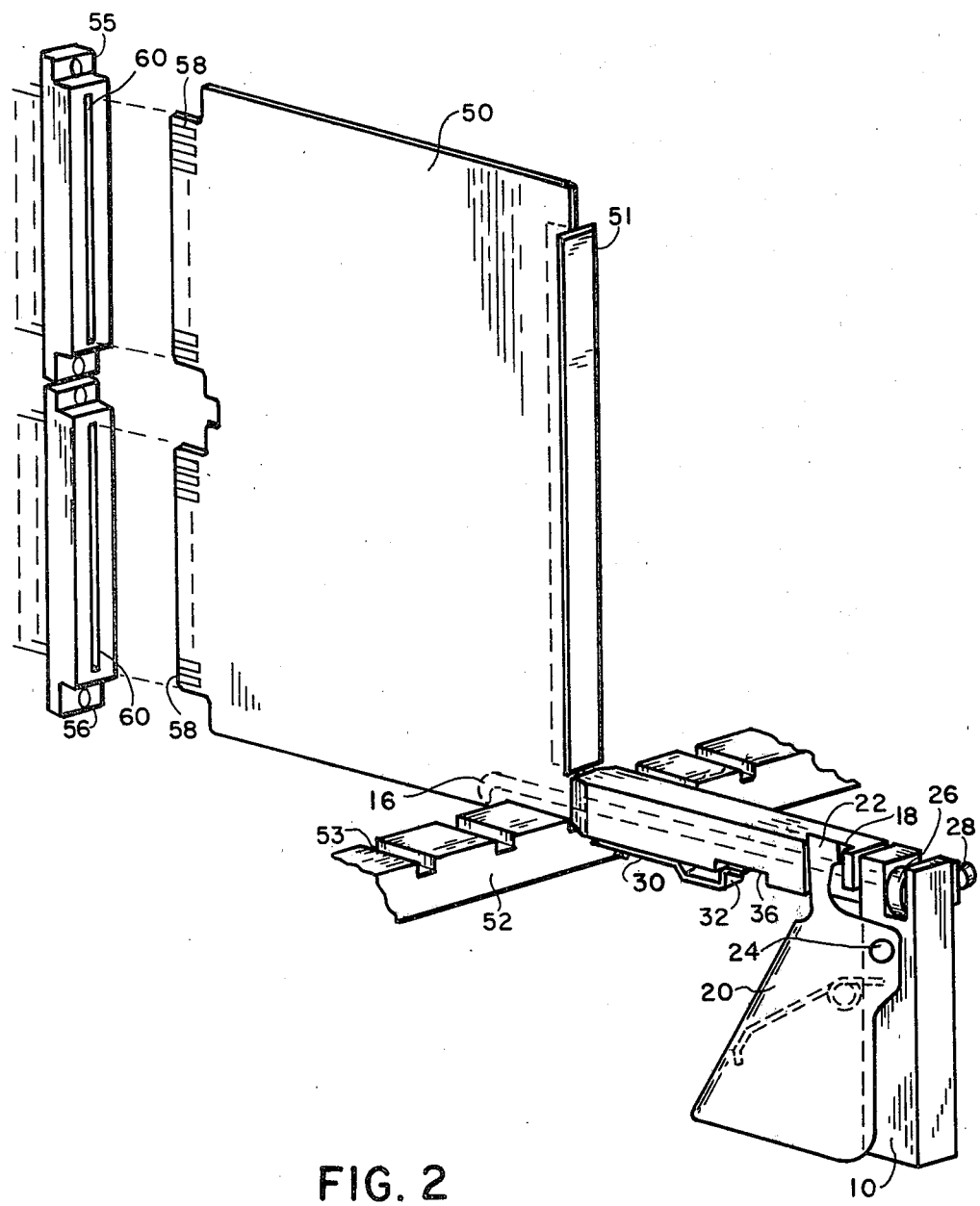
FIG. 2 is a perspective view showing the tool of the present invention used to insert a circuit card.

Turning now to FIG. 2 is can be seen that a circuit card 50 is placed on a horizontal card guide 52 having transverse slot 53 which leads to a pair of connectors 55 and 56. Connectors 55, 56 each include a slot 60, arranged to accept a rear edge of the circuit card and engage contact pads 58. The top card guide has been eliminated from the drawing as well as other card holder structures for ease of explanation. The circuit card 50 is first positioned within the holder between two opposite top and bottom card guide slots and inserted by hand until it reaches the connector entrance. At this point the tool is grasped in either hand and the tab 26 is rotated via handle 28 in the appropriate direction to orient hook 16 in a downward direction. The curved hook is then inserted into the card holder area between the bottom of the card handle 51 and the card guide 52. The hook is then engaged behind the front card guide 52. Plunger groove 17 is nested along the front edge of circuit card 50 below the handle 51. A free hand is then placed on the top of the card handle so as to stabilize the circuit card and the trigger is actuated by compressing trigger 20. Lever 22 is forced forward transmitting the force applied to trigger 20 to the plunger via notch 18. The plunger thus moves forward along shaft 14 transmitting the force to the circuit card, propelling the circuit card forward and inserting the rear edge of the circuit card within slots 60 of the connectors. Upon release of trigger 20, the now compressed spring 38 throws the trigger bracket forward which moves lever 22 backward, returning plunger 12 to its original position. The tool can then be lifted out and removed from the card guide.

Figure 3:
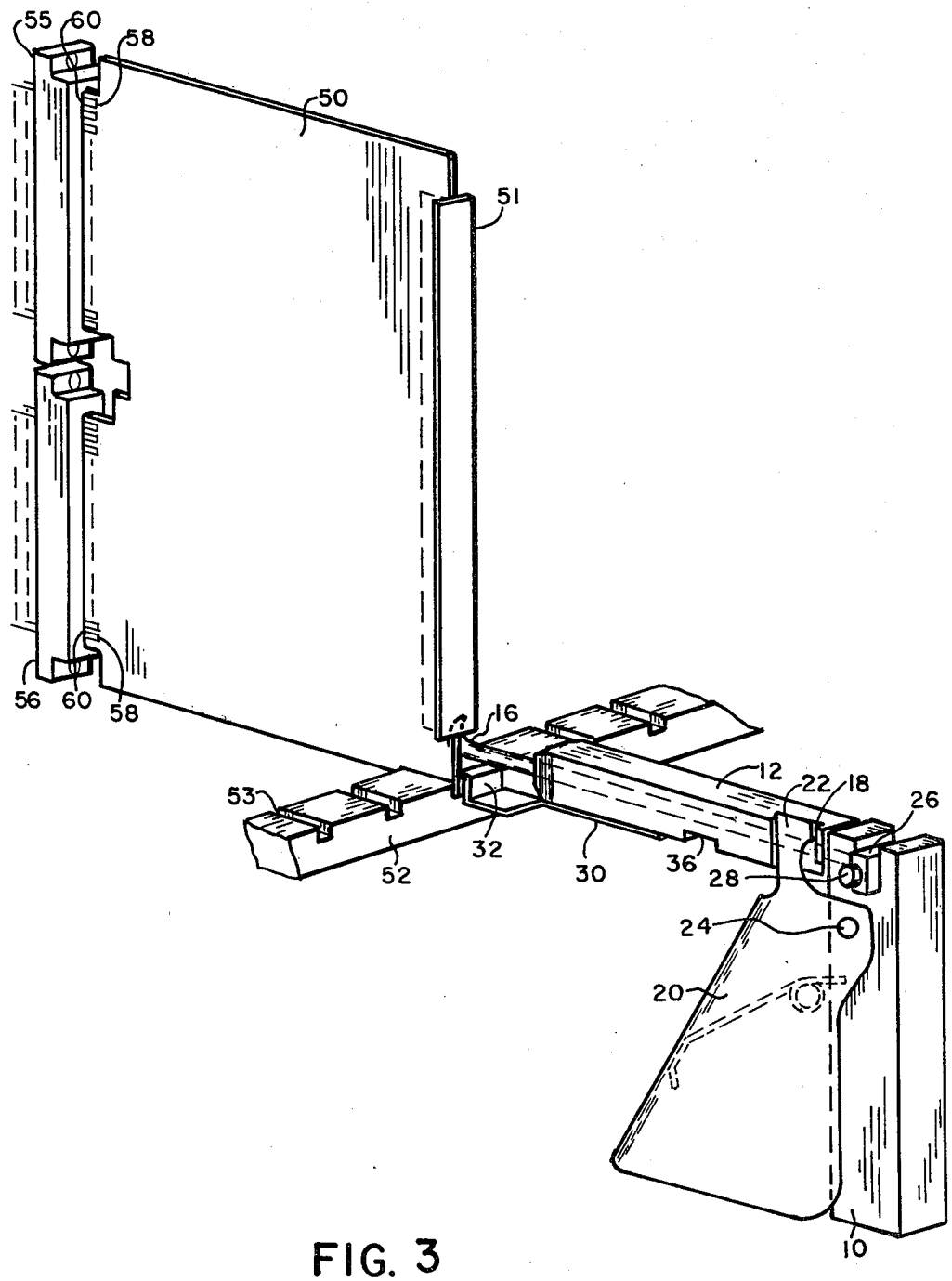
FIG. 3 is a perspective view showing the tool of the present invention used to extract a circuit card.

To extract an installed circuit card using the tool, the tool is grasped in either hand and the handle 28 is rotated in order to point hook 16 upward. As can be seen at FIG. 3 the deviation and stop bracket is then extracted from its stored position and rotated either left or right about pin 34 until shoulder 32 is facing forward with the plunger. The tool is applied by first holding it at a downward angle and inserting it to the holder area below the card handle 51 and card guide 52. The tool is then leveled with hook 16 engaged behind handle 51 and shoulder 32 of the stop bracket resting against a top edge of card guide 52. A free hand is placed at the top of card handle 51 and the trigger 20 squeezed. The force exerted by squeezing trigger 20 is transferred to plunger 12 via lever 22 and notch 18 which allows hook 16 to pull the circuit card out of connectors 55 and 56. Once cleared of the connectors circuit card 50 can be extracted by hand.

In this manner the card is removed from the holder without any damage to the card or connector. The tool of the present invention has advantages in ease operation, portability, and universal usage. It can also be appreciated by those skilled in the art that the tool may be used with cards of different sizes and shapes.

The present invention has been described with reference to a specific embodiment thereof, for the purpose of illustrating the manner in which the invention may be used to advantage, and will be appreciated by those skilled in the art that the invntion is not limited thereto. Accordingly, any and all modifications, variations or equivalent arrangements which may occur to those skilled in the art should be considered to be within the scope of the invention.

What is claimed is:

1. A manipulator for facilitating the insertion of a printed circuit card into a holder and subsequent extraction of said card from the holder, the latter having top and bottom parallel card guides each card guide including at least one transversely oriented guide track having respective lateral card edges resting therein, said circuit card including a handle mounted perpendicular to a transverse edge of said circuit card said manipulator comprising:

a first member having a shaft rotatably mounted projecting outwardly and perpendicular to said first member said shaft terminating in a hooked end and said shaft manually rotatable into an insertion position with said hooked end engaging said bottom card guide adjacent said circuit card and alternatively an extraction position with said hooked end engaging said circuit card handle;

plunger means slideably mounted to said shaft and moveable along said shaft, said plunger including a front face arranged to rest against a transverse edge of said circuit card when said shaft is in said insertion position and alternatively said plunger means including a retainer member manually moveable to extend outward from said plunger means to rest against said bottom card guide when said shaft is rotated into said extraction position;

lever means rotatably mounted to said first member and including first and second sections said first section in communication with said plunger means and said second section disposed to have manual pressure applied thereto, urging said second section toward first member and said first section in response to said pressure moving said plunger means away from said first member, thereby applying a force to said printed circuit card inserting said board into said holder when said shaft is in said insertion position and alternatively extracting said printed circuit card from said holder when said shaft is in said extraction position.

2. A manipulator as defined in claim 1, wherein: said first member is comprised of a rectangular handle having a square cross section, said handle including a bore terminating into a recessed portion and having said shaft inserted within said bore and a rotatable tab housed within said recess, said tab connected to said shaft and arranged to manually rotate into a first position, and consequently rotating said shaft into said insertion position and alternatively a second position rotating said shaft into said extraction position.

3. A manipulator as defined in claim 1, wherein: said plunger is rectangularly shaped and including a longitudinal bore running through said plunger arranged to accept said shaft therein allowing said plunger to be moveable along said shaft, said plunger further including a vertically oriented notch on one face thereof adjacent said handle arranged to accept said lever means first section therein.

4. A manipulator as defined in claim 1, wherein: said lever means second section is comprised of a triangularly shaped trigger, said trigger rotatably mounted to two opposite faces of said handle and having a verticle upstanding leg extending from said trigger forming said lever means first section, said trigger including a wire spring biasing said trigger away from said handle.

5. A manipulator as defined in claim 1, wherein: said plunger front face includes a verticle oriented channel situated off center on said front face and arranged to receive a portion of said circuit card transverse edge therein.

6. A manipulator as defined in claim 1, wherein: said retainer extends outward from a bottom face of said plunger parallel to said shaft and includes an L-shaped front section, said front section arranged to bear against said bottom card guide.

7. A manipulator as defined in claim 6, wherein: said retainer is rotatably mounted to said plunger and said plunger includes a notched portion arranged to accept said retainer L-shaped front section therein when said retainer is rotated away from said card guide.

* * * * *